(12) United States Patent
Onouchi et al.

(10) Patent No.: US 7,443,218 B2
(45) Date of Patent: Oct. 28, 2008

(54) SEMICONDUCTOR INTEGRATED CIRCUIT WITH PULSED CLOCK DATA LATCH

(75) Inventors: Masafumi Onouchi, Kokubunji (JP); Yusuke Kanno, Kodaira (JP); Hiroyuki Mizuno, Musashino (JP); Yasuhisa Shimazaki, Kodaira (JP); Tetsuya Yamada, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 56 days.

(21) Appl. No.: 11/476,040

(22) Filed: Jun. 28, 2006

(65) Prior Publication Data
US 2007/0001734 A1    Jan. 4, 2007

(30) Foreign Application Priority Data
Jun. 29, 2005    (JP)    ............... 2005-189102

(51) Int. Cl.
*H03K 3/00*    (2006.01)
(52) U.S. Cl. ...................... 327/218; 327/199
(58) Field of Classification Search ................. 327/218
See application file for complete search history.

(56) References Cited

U.S. PATENT DOCUMENTS

| | | | |
|---|---|---|---|
| 5,861,762 A * | 1/1999 | Sutherland .................... 326/55 |
| 6,204,707 B1 | 3/2001 | Hamada et al. ............. 327/202 |
| 6,630,853 B1 | 10/2003 | Hamada ..................... 327/202 |
| 2003/0006806 A1 * | 1/2003 | Elappuparackal ............ 327/93 |
| 2003/0160289 A1 * | 8/2003 | Song et al. .................. 257/390 |
| 2004/0160852 A1 * | 8/2004 | Sasagawa ................... 365/233 |

FOREIGN PATENT DOCUMENTS

JP    2000-232339    8/2000
JP    2004-56667    2/2004

OTHER PUBLICATIONS

T. Kitahara et al., "A Clock-Gating Method for Low-Power LSI Design," Proceedings of the ASC-DAC '98 Conference, 1998, pp. 307-312.
M. Hamada et al., "A Conditional Clocking Flip-Flop for Low Power H. 264/MPEG-4 Audio/Visual Codec LSI," IEEE 2005 Custom Integrated Circuits Conference, 2005, pp. 527-530.
Y. Ueda et al., "6.33mw MPEG Audio Decoding on a Multimedia Processor," 2006 IEEE International Solid-State Circuits Conference, Session 22, Low Power Media, 22.7, Feb. 8, 2006, pp. 414-415.

* cited by examiner

*Primary Examiner*—Kenneth B. Wells
*Assistant Examiner*—Ryan C Jager
(74) *Attorney, Agent, or Firm*—Miles & Stockbridge P.C.

(57) ABSTRACT

A low power consumption in a semiconductor integrated circuit device can be achieved by reducing a glitch power in a flip-flop. In a pulse-generator-incorporated auto-clock-gating flip-flop in which data latch is performed by using a pulsed clock, input data is latched based on an output of a dynamic XOR circuit, which is a comparator circuit, during a period when the pulsed clock is at a high level, and the dynamic XOR circuit is cut off during a period when the pulsed clock is at a low level.

18 Claims, 16 Drawing Sheets

SEMICONDUCTOR INTEGRATED CIRCUIT WITH PULSED CLOCK DATA LATCH

CROSS-REFERENCE TO RELATED APPLICATION

The present application claims priority from Japanese Patent Application No. JP 2005-189102 filed on Jun. 29, 2005, the content of which is hereby incorporated by reference into this application.

TECHNICAL FIELD OF THE INVENTION

The present invention relates to a semiconductor integrated circuit device. More particularly, it relates to a technology effectively applied to a system LSI for portable equipment.

BACKGROUND OF THE INVENTION

In recent years, SoC (System-on-a-Chip) such as a system LSI for a mobile phone has become multifunctional mainly because of the increased ease of IP (Intellectual Property) integration.

With the increase in the number of integrated IPs, the power consumption at the time of operation thereof has significantly increased. Therefore, for the LSI for use in portable equipment required to be driven with a limited battery capacity, the low power consumption has become more and more important.

In order to reduce the power consumption at the time of operation of the LSI, a technology called clock gating has been conventionally used because power consumption in a clock system accounts for a large share of the total power consumption in the LSI.

For example, in Kitahara, T. et al., "A Clock-Gating Method for Low-Power LSI Design," Proceedings of the ASC-DAC '98, Conference, pp. 307-312 (Non-patent document 1), it is reported that power consumption can be reduced by 39% or more. However, under present circumstances, implementation of the clock gating is not sufficient (see Non-patent document 1). This is because, in view of the clock distribution, the number of circuits is explosively increased in a lower layer of a clock distribution hierarchy called a clock tree, which makes the conditions for implementing clock gating severer.

The conditions for implementing clock gating are those for determining in which case clock signal is to be distributed or not.

In such an environment, the inventors of the present invention have found that it is relatively easy to implement individual clock gating in a flip-flop disposed at the end of the clock tree, and have studied its implementation method.

As an attempt to implement gating at a flip-flop, for example, circuits as shown in Japanese Patent Application Laid-Open Publication No. 2000-232339 (Patent document 1) and Japanese Patent Application Laid-Open Publication No. 2004-056667 (Patent document 2) have been suggested. However, noise called a glitch that may occur on an actual circuit has not been sufficiently studied (see Patent documents 1 and 2).

SUMMARY OF THE INVENTION

As described above, the power consumption is large in a clock system of a general LSI and it is particularly large in the flip-flop. Therefore, it is important to reduce the power required for the flip-flop.

For the achievement of the power reduction, auto-clock-gating flip-flops have been suggested. The patent document 1 discloses a flip-flop circuit with a clock signal control function and a clock control circuit, and the patent document 2 discloses a conditional clocking flip-flop circuit.

In these flip-flops, as shown in FIG. 19A and FIG. 19B, a clock CLK is dynamically controlled with an inverted value of an exclusive OR between a logical value of input data (D) and a logical value of stored data (Q) of the flip-flop.

First, when the logical value of the input data (D) and the logical value of the stored data (Q) are equal to each other, an exclusive NOR becomes a high level VDD and an output of NOR becomes a low level VSS, and thus an output of NAND is fixed to the high level VDD. As a result, irrespectively of the logical value of a clock (CLK), CKI is fixed to the low level VSS, and CKIB is fixed to the high level VDD.

Next, when the logical value of the input data D and the logical value of the stored data Q are different from each other, exclusive NOR becomes the low level VSS. At this time, if the clock CLK is at the low level VSS, an output of AND is also at the low level VSS, and therefore an output of NOR is at the high level VDD.

At this time, when the clock CLK becomes the high level VDD, the output of NAND is changed to the low level VSS, the internal CKI is changed to the high level VDD, CKIB is changed to the low level VSS, and the input data D is latched into the stored data Q.

As a result, the inverted value becomes the high level VDD, the output of NOR is changed to the low level VSS, the output of NAND is changed to the high level VDD, CKI is changed to the low level VSS, and CKIB is changed to the high level VDD.

Incidentally, since the input data D is not incorporated in this auto-clock-gating flip-flop when the input data is not changed, an effect of the reduction in power consumption can be achieved. However, in an actual LSI, influences of noise called glitch have to be also considered. As a result of consideration of such influences, it has been revealed that power consumption due to the glitch is large in the conventional technology. A glitch means several transitions of a signal between the low level VSS and the high level VDD until the final logical value of the signal is determined.

One reason for such a glitch is a difference in delay time between flip-flops. A glitch can be prevented if the delay times of the flip-flops are exactly equalized. However, such a design is practically impossible. Thus, this is an essential problem in designing a synchronous circuit.

When a glitch occurs in a conventional circuit, a period occurs in which transmission gates connected to the stored data Q and QB are simultaneously in a conductive state, and through current flows between the stored data Q and QB during this period. This through current flows as many times as the number of times the glitch occurs.

As described above, from the viewpoint of the glitch power, the conventional technology is insufficient, and this glitch power has to be reduced.

An object of the present invention is to provide a technology for reducing glitch power of a flip-flop, thereby achieving power consumption reduction of a semiconductor integrated circuit device.

The above and other objects and novel characteristics of the present invention will be apparent from the description of this specification and the accompanying drawings.

The typical ones of the inventions disclosed in this application will be briefly described as follows.

According to the studies prior to the present invention, the inventors of the present invention have reached an understanding that, in order to reduce current caused by the abovementioned glitch, it is important to make a clear distinction among a period of comparing the input data D and the stored data Q, a period of incorporating them, and a period of retaining the stored data Q so as to prevent a glitch during the period of retaining the stored data Q.

For its achievement, the inventors have realized that it is essential to pulse a clock supplied to a normal flip-flop and to clearly separate the short data incorporating period and the long data retaining period. This is because, when a process of comparing the input data D and the stored data Q and a process of updating the stored data Q are performed in as short period as possible and the entire remaining period is allocated for retaining the stored data Q and preventing a glitch, the feedback control is required for a clock signal with a duty ratio of 50%.

Since a comparison result between the input data D and the stored data Q is required in the feedback control, the input data D and the stored data Q have to be compared even during the period of retaining the stored data Q. In such a case, similar to the conventional technology, the through current flows due to a glitch.

Furthermore, in the present invention, a pulsed clock is used only for the distribution to flip-flops (FF) and is laid out as a macro cell. By this means, an influence on a conventional design flow is minimized.

The effects obtained by typical aspects of the present invention will be briefly described below.

(1) Since the power in the flip-flop, in particular, glitch power can be reduced, the reduction in power consumption can be achieved in a semiconductor integrated circuit device.

(2) Also, a flip-flop with low power consumption can be implemented without significantly changing the conventional design flow. Thus, it is possible to achieve a semiconductor integrated circuit device with low power consumption at low cost.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
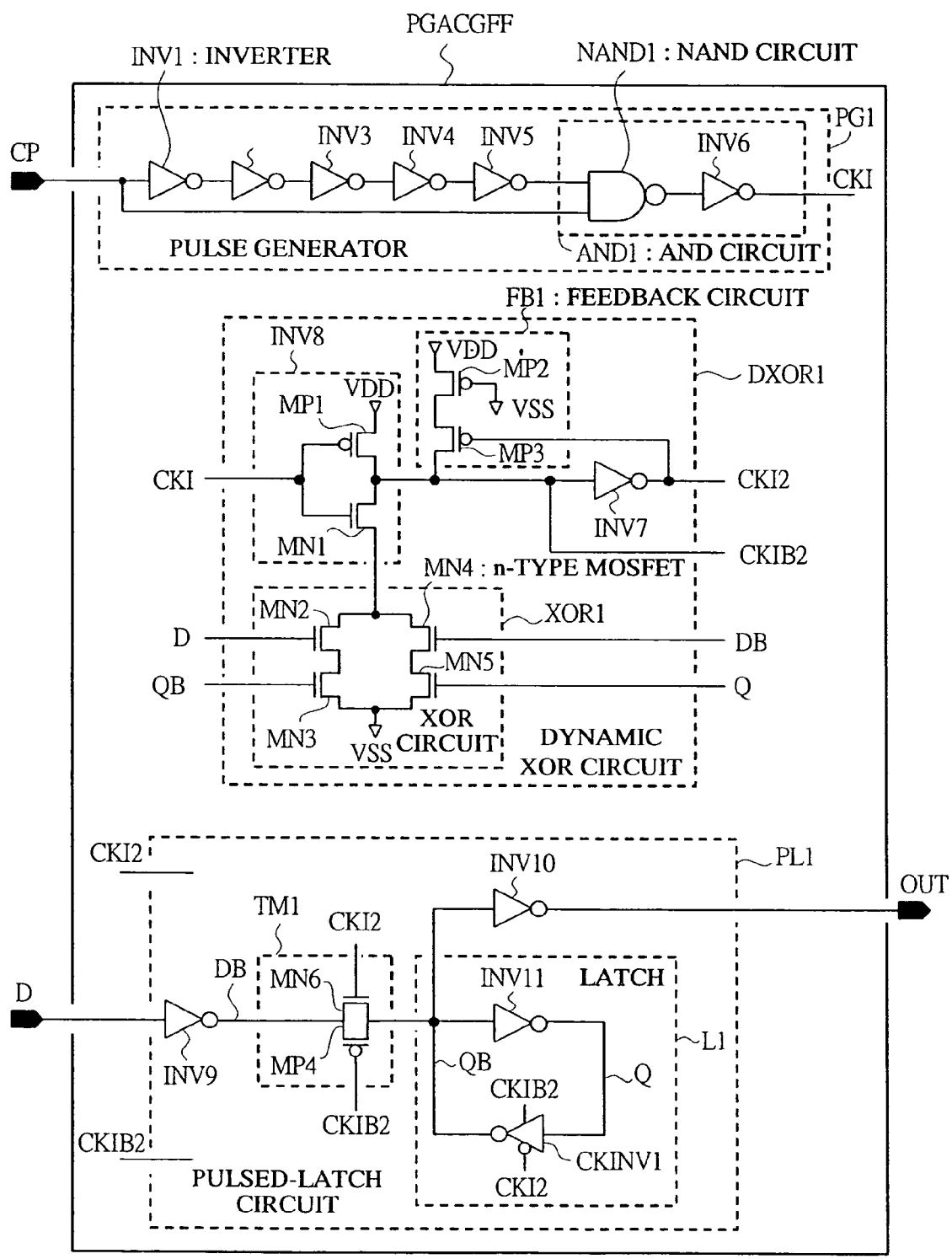
FIG. 1 is a circuit diagram showing a configuration example of a pulse-generator-incorporated auto-clock-gating flip-flop according to an embodiment of the present invention.

FIG. 1 is a circuit diagram showing a basic configuration of a pulse-generator-incorporated auto-clock-gating flip-flop PGACGFF according to the present invention.

The auto-clock-gating flip-flop PGACGFF of FIG. 1 includes a pulse generator PG1, a dynamic XOR (exclusive OR) circuit (data comparator circuit) DXOR1, and a pulsed-latch circuit (data latch circuit) PL1. The pulse generator PG1 converts a clock CP with a duty ratio of 50% to a pulsed clock CKI having a short period of high level VDD. The dynamic XOR circuit DXOR1 compares input data D and stored data Q by using the input data D, the stored data Q, and logical values of inverted logics DB and QB of the data D and Q and then dynamically cuts off the pulsed clock CKI based on the comparison result. The pulsed-latch circuit PL1 stores a logical value of the input data D as the stored data Q by using a period in which the pulsed clock CKI is at the high level VDD.

The pulse generator PG1 includes an odd number of inverters INV1 to INV5 forming an inverter chain and an AND circuit AND1 composed of an NAND (negative AND) circuit NAND1 and an inverter INV6. In this case, the number of stages in an inverter chain is 5. However, this number can be appropriately changed in accordance with the pulse width generated in the pulse generator PG1.

The dynamic XOR circuit DXOR1 includes inverters INV7 and INV8, an XOR circuit XOR1 composed of four n-type MOSFETs (Metal Oxide Semiconductor Field Effect Transistors) MN2 to MN5, and a feedback circuit FB1 composed of two p-type MOSFETs MP2 and MP3.

The pulsed-latch circuit PL1 includes two inverters INV9 and INV10, a transmission gate TM1 composed of a p-type MOSFET MP4 and an n-type MOSFET MN6, and a latch circuit L1 composed of an inverter INV11 and a clocked inverter CKINV1.

In the pulse generator PG1, a clock CP is connected to the inverters INV1 to INV5 and one end of the AND circuit AND1, and an output of the inverters INV1 to INV5 is connected to the other end of the AND circuit AND1.

In the dynamic XOR circuit DXOR1, the pulsed clock CKI is connected to the inverter INV8. The XOR circuit XOR1 is connected to an n-type MOSFET MN1 of the inverter INV8. The inverter INV7 is connected to an inverted signal CKIB2 of an output internal pulsed clock of the inverter INV8. The feedback circuit FB1 is connected in parallel to an internal pulsed clock CKI2 of the inverter INV7 and its inverted signal CKIB2.

In the pulsed-latch circuit PL1, an input data D is connected to the inverter INV9. An output DB of the inverter INV9 is connected to the transmission gate TM1. An output QB of the transmission gate TM1 is connected to the latch circuit L1 and the inverter INV10. An output of the inverter INV10 is an output data OUT. Also, the internal pulsed clock CKI2 and its inverted signal CKIB2 are connected to the transmission gate TM1 and the clocked inverter CKINV1, respectively.

A feature of the present invention is to perform the cutoff control of the pulsed clock CKI during a period when the logical value of the pulsed clock CKI is at the high level VDD by using the input data D, the stored data Q, and their inverted logical values DB and QB.

Another feature of the present invention is to suppress unwanted power consumption due to a glitch of the input data D by using a period when the logical value of the pulsed clock CKI is at the low level VSS.

The cutoff control of the pulsed clock CKI is performed during the period when the logical value of the pulsed clock CKI is at the high level VDD and is achieved by forwarding the pulsed clock CKI to the subsequent stage only when the input data D and the stored data Q have different logical values.

This is because, at this time, the set of the n-type MOSFETs MN2 and MN3 and the set of the n-type MOSFETs MN4 and MN5 forming the XOR circuit XOR1 are selectively turned on in accordance with the logical values of the input data D and the stored data Q, which makes it possible to drive the inverter INV8.

When the inverter INV8 is driven, the pulsed clock CKI makes transitions of VSS→VDD→VSS. With this transition, the inverted signal CKIB2 of the internal pulsed clock makes transitions of VDD→VSS→VDD.

As a result, the transmission gate TM1 is placed in a conductive state and the clocked inverter CKINV1 is driven. By this means, the logical value of the stored data Q is updated to the logical value of the input data D.

Also, when the input data D and the stored data Q have the same logical value, the set of the n-type MOSFETs MN2 and MN5 or the set of the n-type MOSFETs MN3 and MN4 forming the XOR circuit XOR1 is selectively turned on, and the XOR circuit is thus turned off. Therefore, even if the logical value of the pulsed clock CKI makes transitions of VSS→VDD→VSS, the logical value of the inverted signal CKIB2 of the internal pulsed clock remains at the high level VDD.

At this time, the inverted signal CKIB2 of the internal pulsed clock is momentarily in a floating state. However, since the feedback circuit FB1 provides a feedback to the inverted signal CKIB2 of the internal pulsed clock, there is no need to worry about an erroneous operation.

Figure 2:
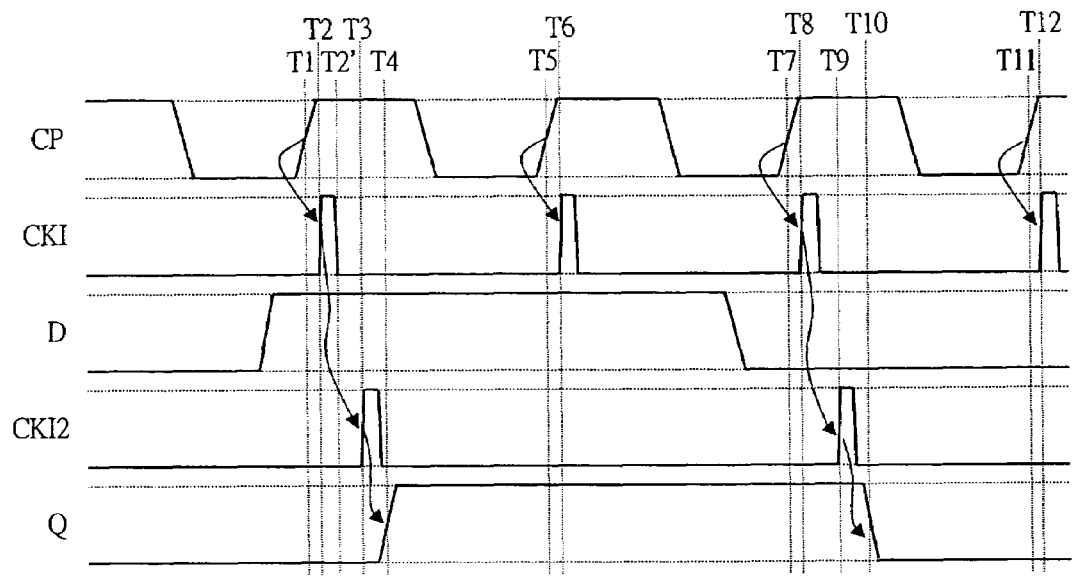
FIG. 2 is a timing chart showing one example of the operation in the pulse-generator-incorporated auto-clock-gating flip-flop of FIG. 1.

The basic operation of the present invention shown in FIG. 1 will be described with reference to FIG. 2.

Operating waveforms in the case where the logical value of the input data D and the logical value of the stored data Q are different from each other are shown at each time from T1 to T4 and from T7 to T10, and operating waveforms in the case where the logical value of the input data D and the logical value of the stored data Q are equal to each other are shown at each time from T5 to T6 and from T11 to T12.

First, the case where the input data D is changed from the low level VSS to the high level VDD and the input data is incorporated will be described.

When the clock CP of the pulse generator PG1 is changed as VSS→VDD, a delay T2'-T2 of the inverters INV1 to INV5 appears as a pulse, and the pulsed clock CKI is changed as VSS→VDD→VSS.

The pulsed clock CKI is inputted to the dynamic XOR circuit DXOR1. Since the input data D is at the high level and the stored data Q is at the low level VSS at the time T3, two n-type MOSFETs MN2 and MN3 forming the XOR circuit XOR1 are turned on, which makes it possible to drive the inverter INV8.

As a result, although not shown here, the inverter INV8 is driven to change the inverted signal CKIB2 of the internal pulsed clock as VDD→VSS→VDD and also change the internal pulsed clock CKI2 as VSS→VDD→VSS.

During a period when the internal pulsed clock CKI2 is at the high level VDD and the inverted signal CKIB2 of the internal pulsed clock is at the low level VSS, the transmission gate TM1 of the pulsed-latch circuit PL1 is closed, and the clocked inverter CKINV1 is open. Therefore, at the time T4, the logical value of the input data D of the pulsed-latch circuit PL1 is written to the stored data Q.

Next, the case where the input data D is changed from the high level VDD to the low level VSS and the input data D is incorporated will be described.

When the clock CP of the pulse generator PG1 is changed as VSS→VDD at the time T7, similar to the case where the input data D makes a transition from the low level VSS to the high level VDD, a delay in the inverter chain appears as a pulse, and the pulsed clock CKI is changed as VSS→VDD→VSS. Then, at the time T8, the pulsed clock CKI is changed as VSS→VDD→VSS.

In this case, since the input data D is at the low level VSS and the stored data Q is at the high level VDD, two n-type MOSFETs MN4 and MN5 forming the dynamic XOR circuit DXOR1 are turned on, which makes it possible to drive the inverter INV8.

At the time T9, the inverted signal CKIB2 of the internal pulsed clock is changed as VDD→VSS→VDD, and the internal pulsed clock CKI2 is changed as VSS→VDD→VSS. During a period when the internal pulsed clock CKI2 is at the high level VDD and the inverted signal CKIB2 of the internal pulsed clock is at the low level VSS, the transmission gate TM1 of the pulsed-latch circuit PL1 is closed and the clocked inverter CKINV1 is open. Therefore, at the time T10, the logical value of the input data D of the pulsed-latch circuit PL1 is written to the stored data Q.

On the other hand, the case where the input data D is not changed will be described.

First, the case where the input data D and the stored data Q are both at the high level VDD will be described. Since the clock CP rises to the high level VDD at the time T5, the pulsed clock CKI is changed as VSS→VDD→VSS at the time T6. In this case, since the logical value of the input data D and the logical value of the stored data Q are equal to each other at the high level VDD, two n-type MOSFETs MN3 and MN4 forming the XOR circuit XOR1 in the dynamic XOR circuit DXOR1 are turned on, but the inverter INV8 is not driven.

As a result, the internal pulsed clock CKI2 remains at the previous low level VSS. At the time T6 when the pulsed clock CKI becomes the high level VDD, the inverted signal CKIB2 of the internal pulsed clock is momentarily in a floating state. However, owing to the presence of the feedback circuit FB1, the inverted signal CKIB2 of the internal pulsed clock can be kept at the high level VDD.

Next, since the clock CP rises to the high level VDD at the time T11, the pulsed clock CKI which is an output from the pulse generator PG1 is changed as VSS→VDD→VSS at the time T12. In this case, however, since the logical value of the input data D and the logical value of the stored data Q are equal to each other at the low level VSS, two n-type MOSFETs MN2 and MN5 forming the XOR circuit XOR1 in the dynamic XOR circuit DXOR1 are turned on, but the inverter INV8 is not driven.

As a result, the internal pulsed clock CKI2 remains at the previous low level VSS. At the time T12 when the pulsed clock CKI becomes the high level VDD, the inverted signal CKIB2 of the internal pulsed clock is momentarily in a floating state. However, owing to the presence of the feedback circuit FB1, the inverted signal CKIB2 of the internal pulsed clock remains at the high level VDD.

In the foregoing, the operation of the flip-flop according to the present invention at the time of normal operation has been described. Next, the operation of the pulse-generator-incorporated auto-clock-gating flip-flop PGACGFF when a glitch occurs in the input data D, which is a conventional problem to be solved by the present invention will be described.

When a glitch as external noise occurs in the input data D, unwanted power consumption is required in the conventional technology. By contrast, according to the present invention, such unwanted power consumption can be suppressed.

In the present invention, a high resistance can be achieved against a glitch which occurs in the input data D during a period when the logical value of the pulsed clock CKI is at the low level VSS. During this period, since the transmission gate TM1 is in an off state, even when the logical value of the input data D transits, this transition drives only the inverter INV9 and the gates of two n-type MOSFETs MN2 and MN4. Therefore, the power consumption due to the glitch in the input data D is only the power consumption in the inverter INV9 and gate charge and discharge power in the two n-type MOSFETs MN2 and MN4.

Figure 3:
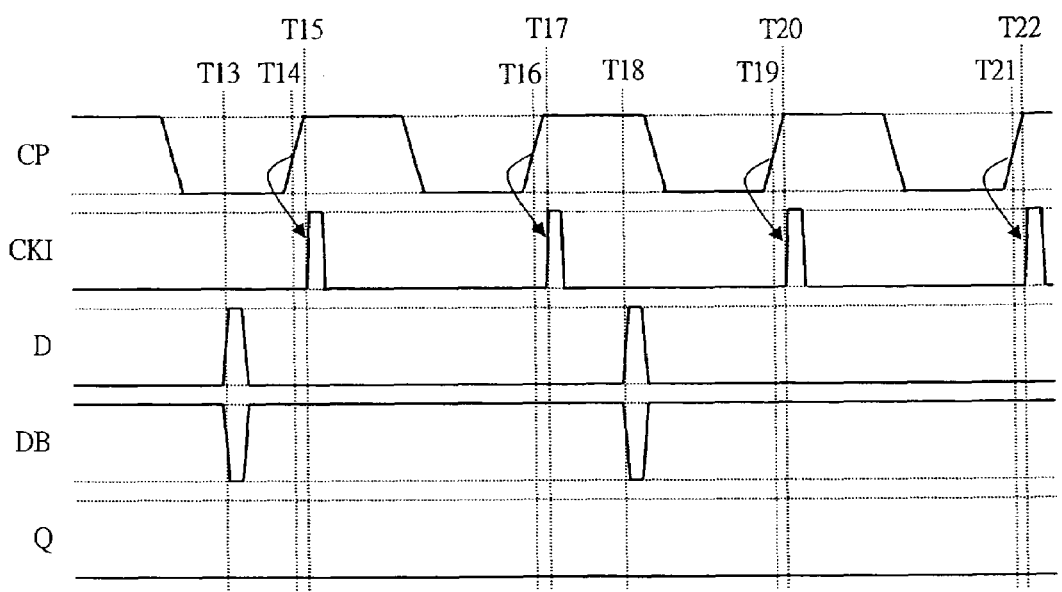
FIG. 3 is a timing chart showing an exemplary operation in the case where a glitch occurs in the input data in the pulse-generator-incorporated auto-clock-gating flip-flop of FIG. 1.

The operation in the case where a glitch occurs in the input data D will be described with reference to FIG. 3.

First, an example in which a glitch occurs in the input data D when the logical value of the input data D is at the low level VSS will be described.

At the time T13, a glitch occurs in the input data D, which causes the change as VSS→VDD→VSS. However, since the pulsed clock CKI is at the low level VSS, this glitch only drives the inverter INV9 and the following propagation of this glitch is prevented.

Therefore, the power consumed at this time is only the driving power of the inverter INV9 and the gate charge and discharge power in these two n-type MOSFETs MN2 and MN4. The same goes for the operation of the pulse-generator-incorporated auto-clock-gating flip-flop PGACGFF at the time T18.

Note that, in this example, a glitch causing a transition as VSS→VDD→VSS occurs in the input data D when the logical value of the input data D is at the low level VSS. Also, power consumption in the case where a glitch causing a transition as VDD→VSS→VDD occurs in the input data D when the logical value of the input data D is at the high level VDD can be similarly suppressed.

Furthermore, the clock CP rises at the times T14, T16, T19, and T21, and the pulsed clock CKI rises at the times T15, T17, T20, and T22 delayed by the inverters INV1 to INV5 of the pulse generator PG1. However, since the input data D and the stored data Q are both at the low level VSS, as described with reference to FIG. 2, the internal pulsed clock CKI2 is not changed, thereby achieving low power consumption.

Figure 4:
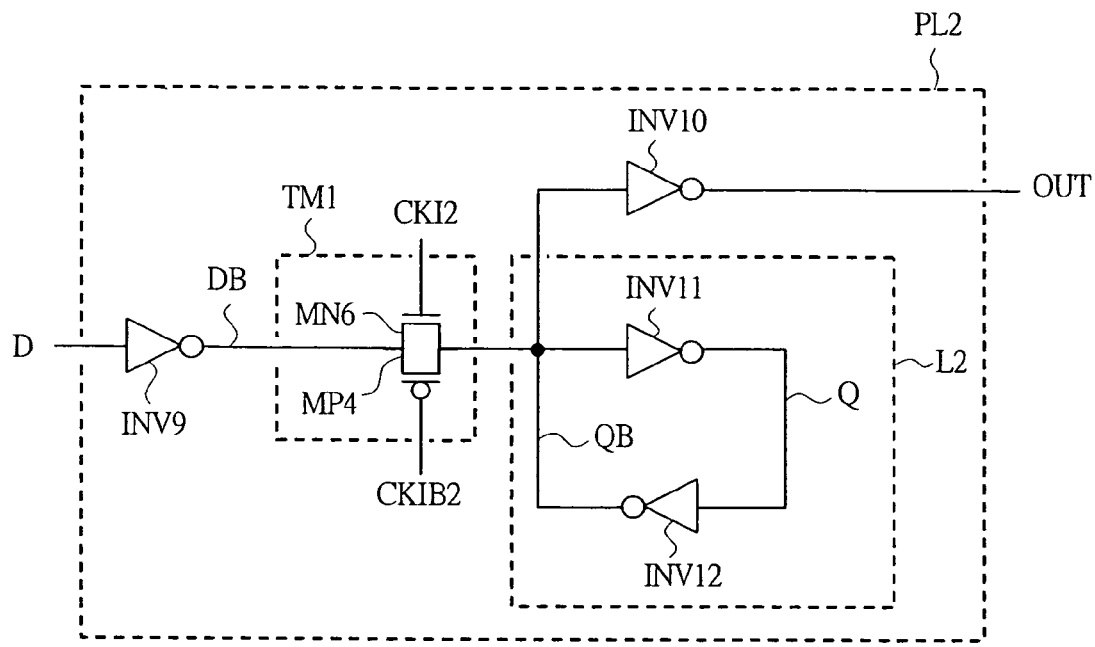
FIG. 4 is a circuit diagram showing another configuration example of a pulsed-latch circuit provided in the pulse-generator-incorporated auto-clock-gating flip-flop of FIG. 1.

FIG. 4 depicts a modification example of the pulsed-latch circuit PL1 shown in FIG. 1.

If it is acceptable to reduce the operation speed of the pulsed-latch circuit PL1, it is possible to reduce the area of the pulsed-latch circuit PL1 by replacing the clocked inverter CKINV1 in the pulsed-latch circuit PL1 by an inverter INV12. In FIG. 4, area reduction by two MOSFETs can be achieved. Note that the effect achieved in FIG. 4 can be implemented together with those in FIG. 5 to FIG. 8 which will be described below.

Figure 5:
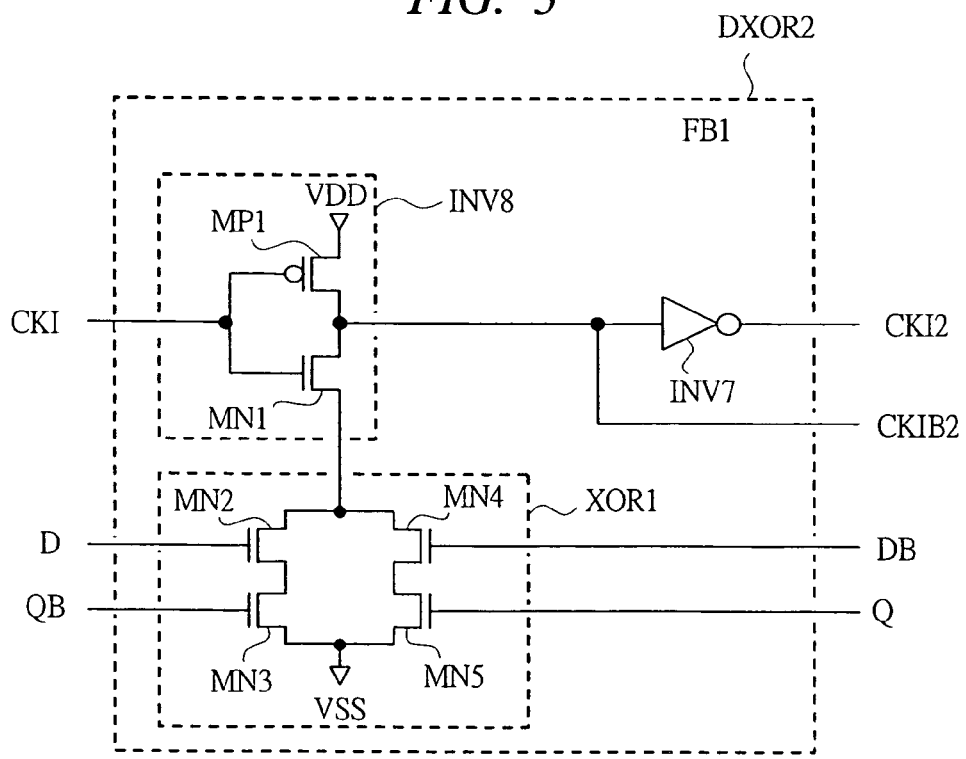
FIG. 5 is a circuit diagram showing another configuration example of a dynamic XOR circuit provided in the pulse-generator-incorporated auto-clock-gating flip-flop of FIG. 1.

FIG. 5 depicts a modification example of the dynamic XOR circuit DXOR1 shown in FIG. 1.

When the logical value of the pulsed clock CKI is at the high level VDD in the case where the logical value of the input data D and the logical value of the stored data Q are equal to each other, the inverted signal CKIB2 of the internal pulsed clock in the dynamic XOR circuit DXOR1 is momentarily in a floating state because a path to the high level VDD is cut off. However, if a clock frequency is high, in consideration of a time constant of discharge due to a leakage current, the level of the floating state does not exceed a logical threshold in some cases.

In such a case, it is possible to achieve the reduction in the area of the dynamic XOR circuit DXOR1 by eliminating the feedback circuit FB1. In FIG. 5, area reduction by two MOSFETs can be achieved. Note that the effect achieved in FIG. 5 can be implemented together with those in FIG. 4 and FIG. 6 to FIG. 8.

Figure 6:
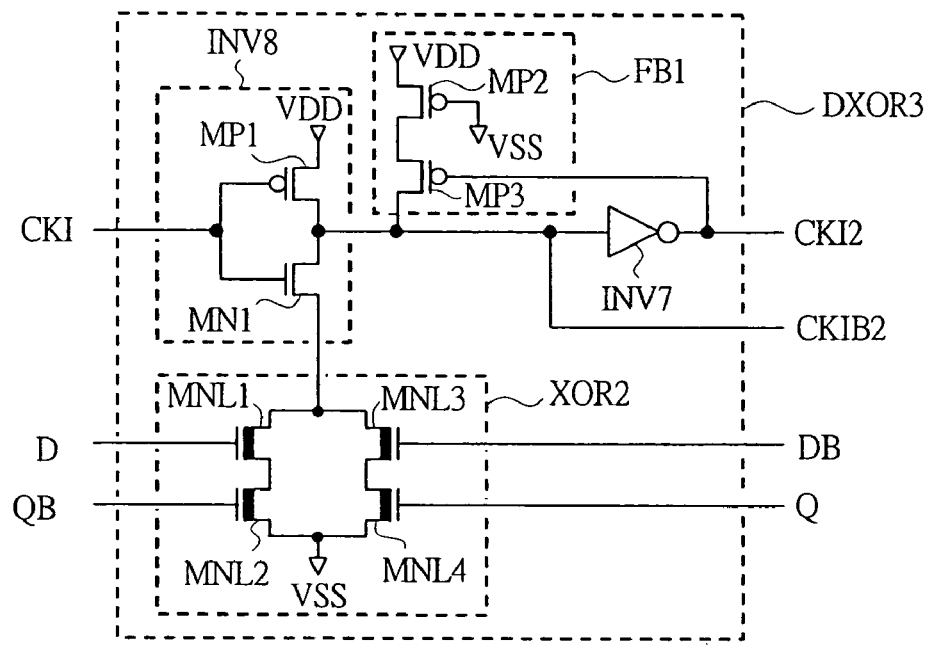
FIG. 6 is a circuit diagram showing another configuration example of the dynamic XOR circuit provided in the pulse-generator-incorporated auto-clock-gating flip-flop of FIG. 1.

FIG. 6 depicts another modification example of the dynamic XOR circuit DXOR1 shown in FIG. 1.

If two types of MOSFETs having different threshold values can be used, it is possible to achieve the increase in the control speed of cutting off the pulsed clock CKI by replacing the four n-type MOSFETs forming the XOR circuit XOR1 in the dynamic XOR circuit DXOR1 by an XOR circuit XOR2 composed of n-type MOSFETs MNL1 to MNL4 having a low threshold voltage. Note that the effect achieved in FIG. 6 can be implemented together with those in FIG. 4, FIG. 5, FIG. 7, and FIG. 8.

Figure 7:
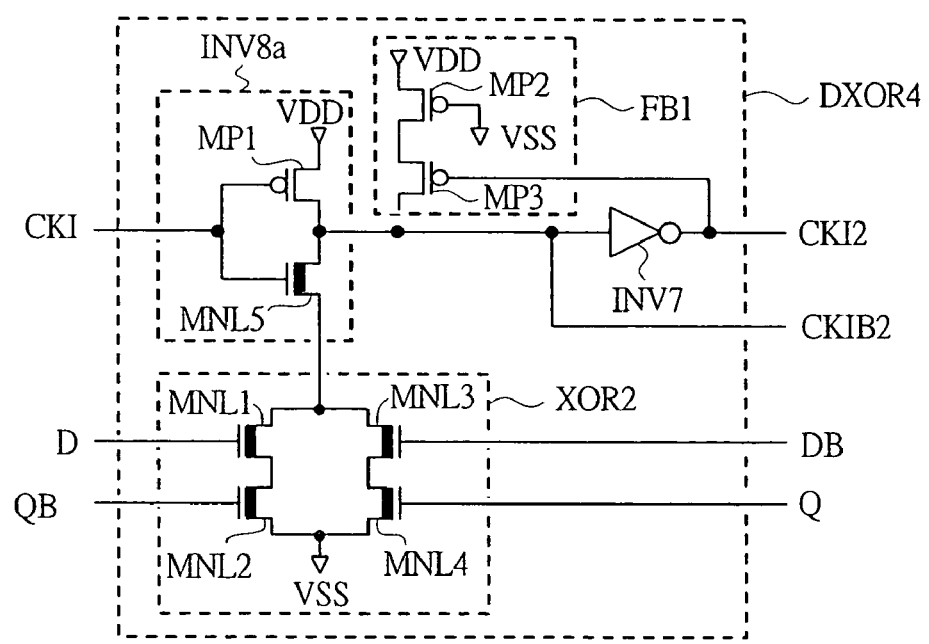
FIG. 7 is a circuit diagram showing another configuration example of the dynamic XOR circuit of FIG. 6.

FIG. 7 depicts another modification example of the dynamic XOR circuit DXOR1 shown in FIG. 6.

If two types of MOSFETs having different threshold values can be used, it is possible to achieve the further increase in the control speed of cutting off the pulsed clock CKI by replacing the n-type MOSFET forming the inverter circuit INV8 by an n-type MOSFET MNL5 having a low threshold voltage to form an inverter circuit INV8a as well as the four n-type MOSFETs forming the XOR circuit XOR2 in a dynamic XOR circuit DXOR3.

When using a MOSFET having a low threshold voltage, the leakage current is increased in general. In this embodiment, however, since three MOSFETs having a low threshold voltage are connected in series, a leakage current is not much increased. Note that the effect achieved in FIG. 7 can be implemented together with those in FIG. 4 to FIG. 6 and FIG. 8.

Figure 8:
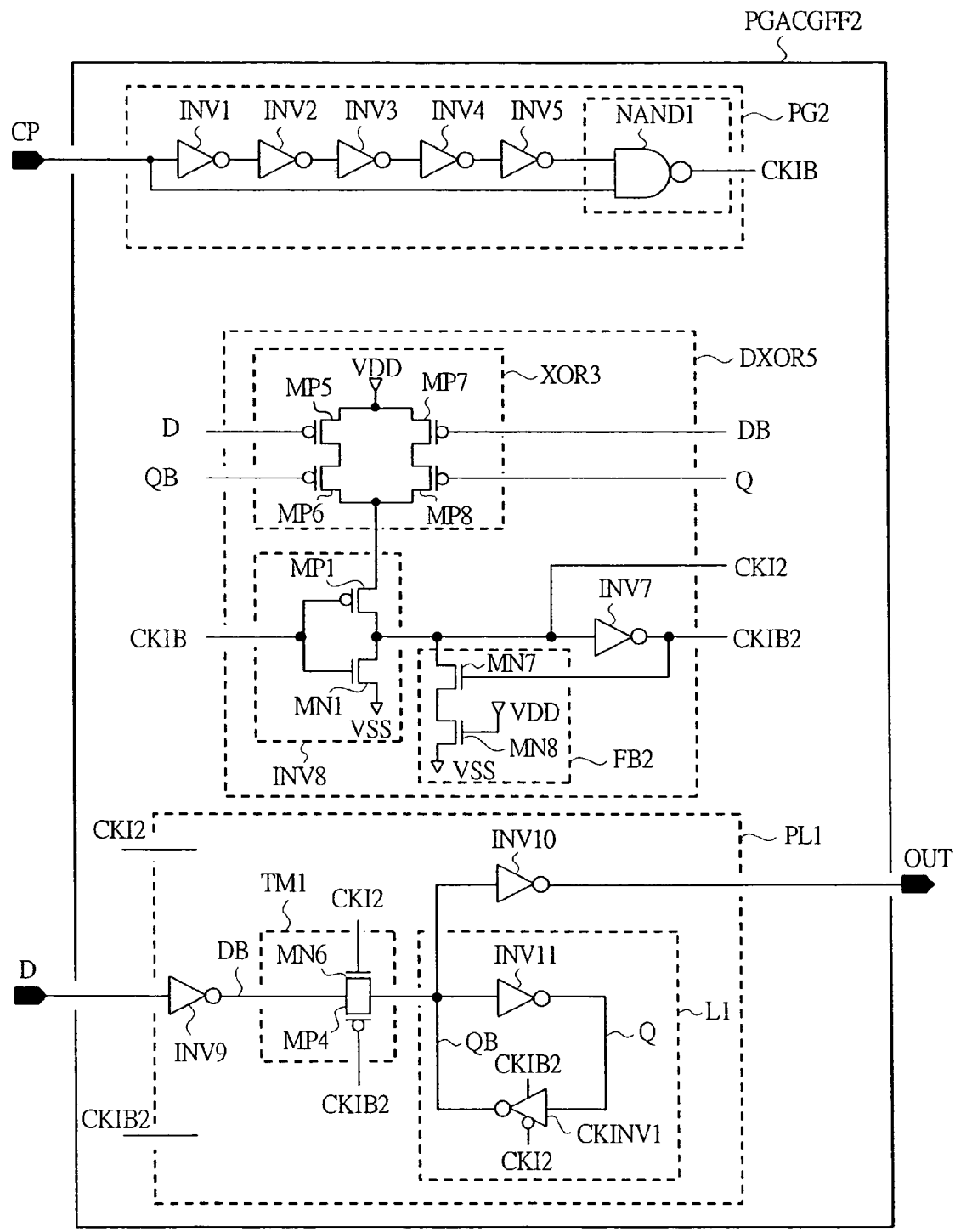
FIG. 8 is a circuit diagram showing another example of the pulse generator and the dynamic XOR circuit provided in the pulse-generator-incorporated auto-clock-gating flip-flop of FIG. 1.

FIG. 8 depicts a configuration example of a pulse-generator-incorporated auto-clock-gating flip-flop PGACGFF obtained by modifying the pulse generator PG1 and the dynamic XOR circuit DXOR1 shown in FIG. 1.

If p-type MOSFETs can be used to form an XOR logic, it is possible to reduce the area of the pulse generator PG1 by removing the inverter INV6 from the elements forming the AND circuit AND1, connecting an XOR circuit XOR3 obtained by using p-type MOSFETs MP5 to MP8 in place of the XOR circuit XOR1 in the dynamic XOR circuit DXOR1 to the p-type MOSFET MP1 of the inverter INV8 in series, and using n-type MOSFETs MN7 and MN8 in place of the feedback circuit FB1 to form the feedback circuit FB2. Note that the effect achieved in FIG. 8 can be implemented together with those in FIG. 4 to FIG. 7.

Figure 9:
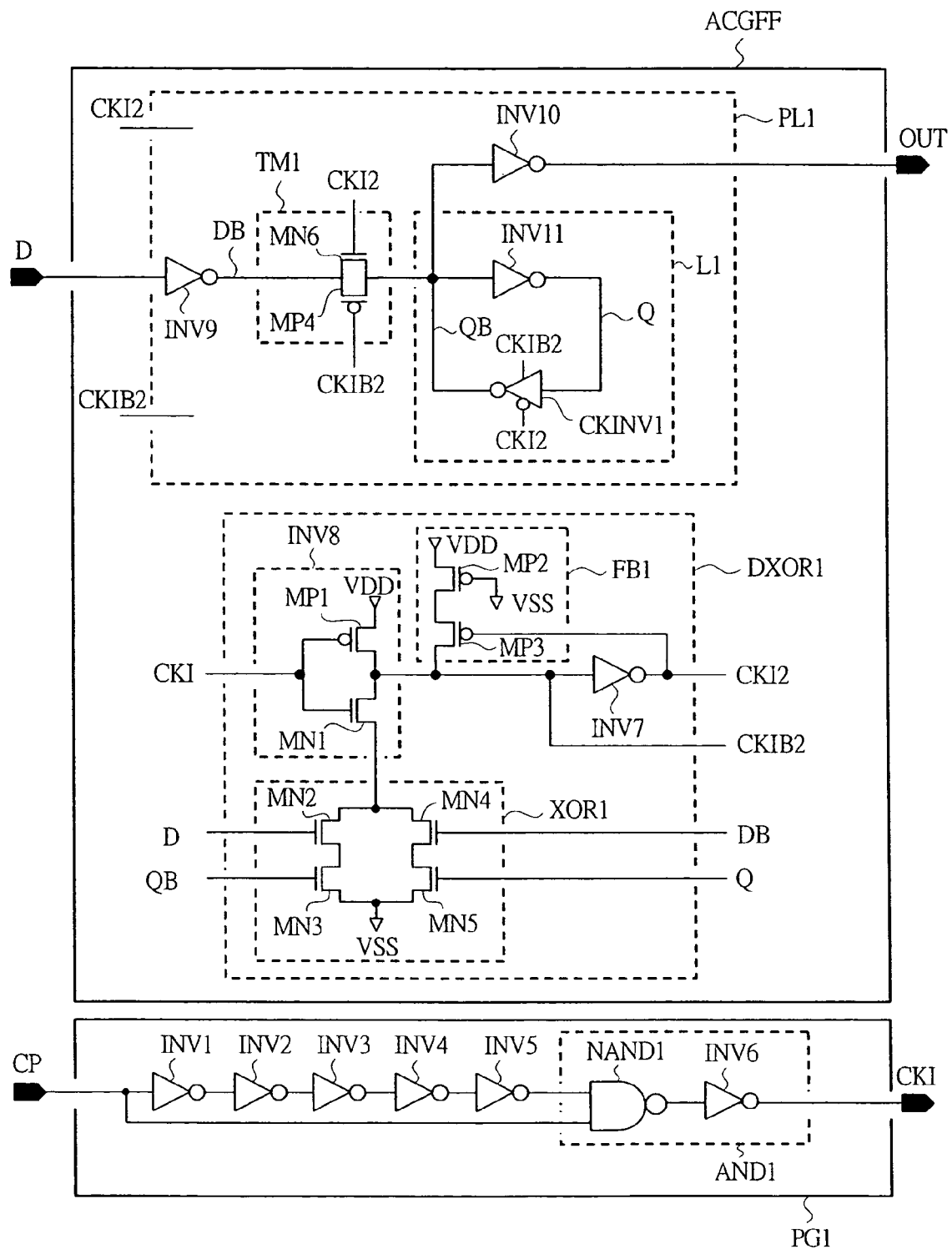
FIG. 9 is an explanatory diagram showing one example of a cell image in the pulse-generator-incorporated auto-clock-gating flip-flop of FIG. 1.
Figure 10:
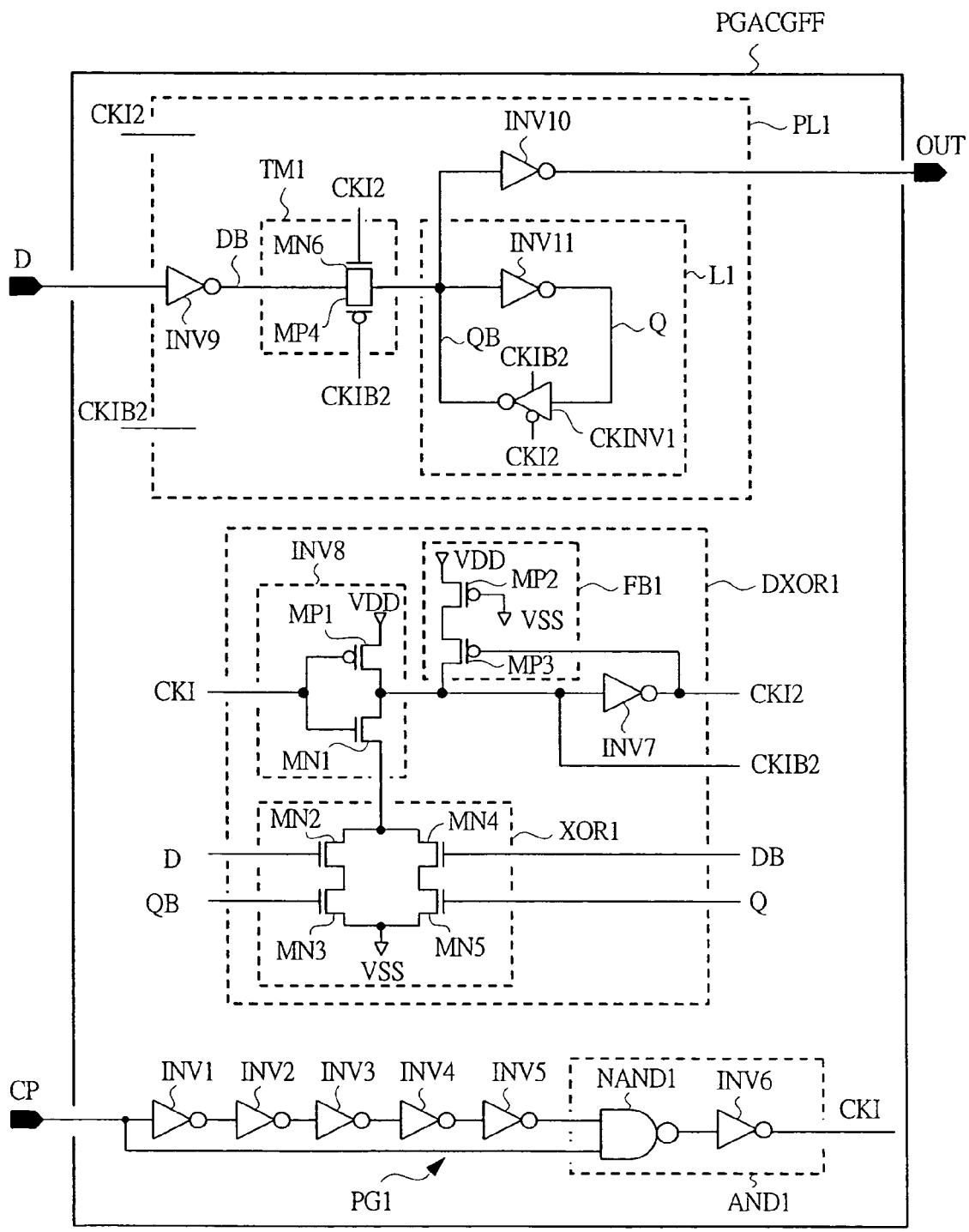
FIG. 10 is an explanatory diagram showing another example of the cell image in the pulse-generator-incorporated auto-clock-gating flip-flop of FIG. 1.

FIG. 9 and FIG. 10 depict cell images of the pulse-generator-incorporated auto-clock-gating flip-flop PGACGFF.

FIG. 9 depicts the case where an auto-clock-gating flip-flop ACGFF composed of the dynamic XOR circuit DXOR1 and the pulsed-latch circuit PL1 is taken as one cell and the pulse generator PG1 is separately provided. An input pin of a cell of the pulse generator PG1 is a clock CP and an output pin thereof is a pulsed clock CKI. An input pin of the auto-clock-gating flip-flop ACGFF is a pulsed clock CKI and an input data D, and an output pin thereof is an output data OUT.

FIG. 10 depicts the case where the pulse generator PG1, the dynamic XOR circuit DXOR1, and the pulsed-latch circuit PL1 are taken as one cell. Input pins of the pulse-generator-incorporated auto-clock-gating flip-flop PGACGFF are a clock CP and the input data D, and an output pin thereof is an output data OUT.

Figure 11:
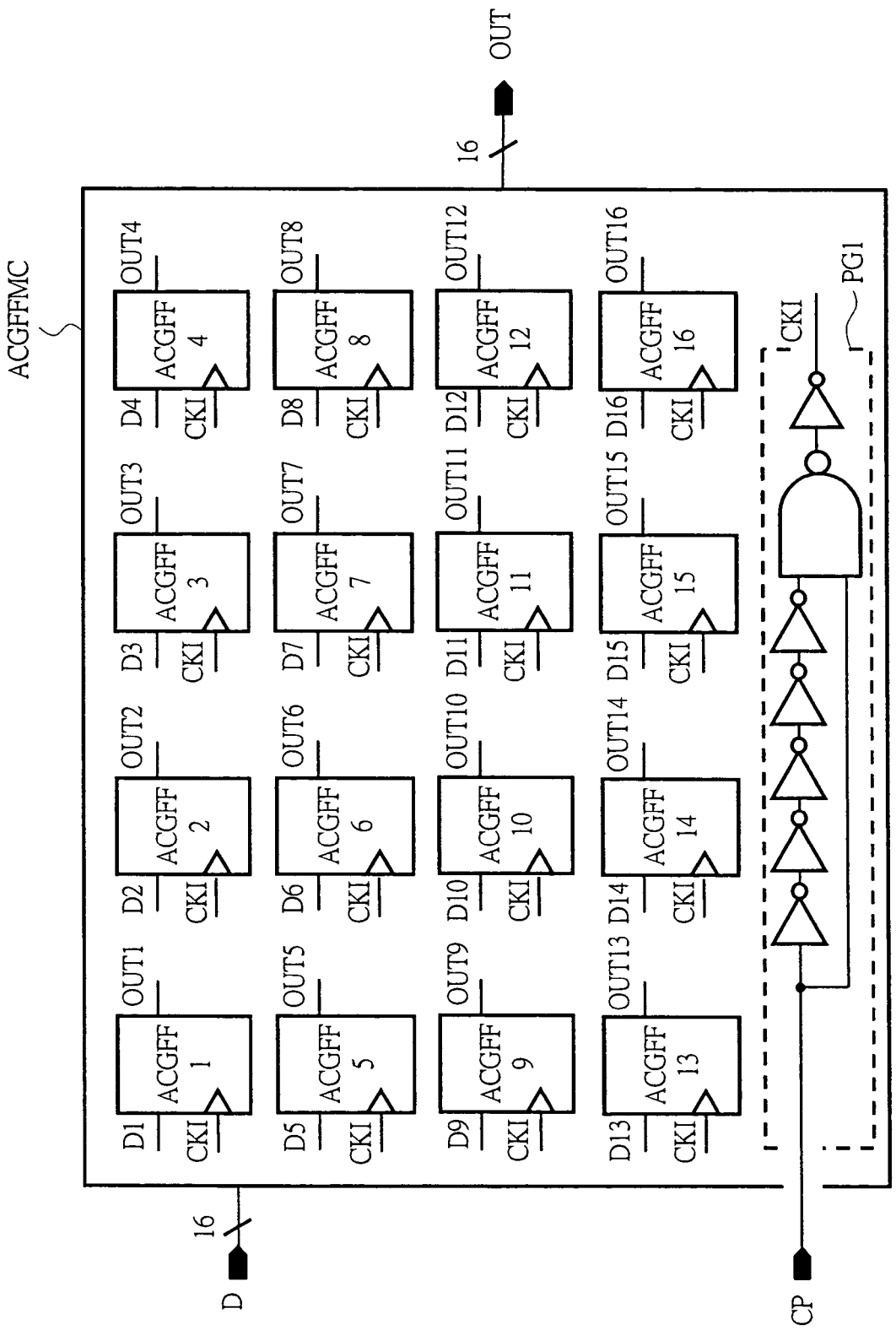
FIG. 11 is an explanatory diagram showing an image of a macro cell according to one embodiment of the present invention.

FIG. 11 depicts an image of an ACGFF macro cell ACGFFMC in which plural auto-clock-gating flip-flops ACGFF are disposed for one pulse generator PG1. In the example of FIG. 11, sixteen auto-clock-gating flip-flops ACGFF are disposed for one pulse generator PG1.

An input pin of the ACGFF macro cell ACGFFMC is the clock CP and the input data D having a 16-bit width, and an output pin thereof is the output data OUT having a 16-bit width. A cell in which the pulse generator PG1 and the auto-clock-gating flip-flop ACGFF are laid out together is called a hard macro cell.

With this hard macro cell, the pulse width for VSS→VDD→VSS of the pulsed clock CKI in the auto-clock-gating flip-flop ACGFF can be ensured. Note that the number of auto-clock-gating flip-flops ACGFF disposed in one ACGFF macro cell ACGFFMC may be arbitrary as long as it is equal to one or more.

Figure 12:
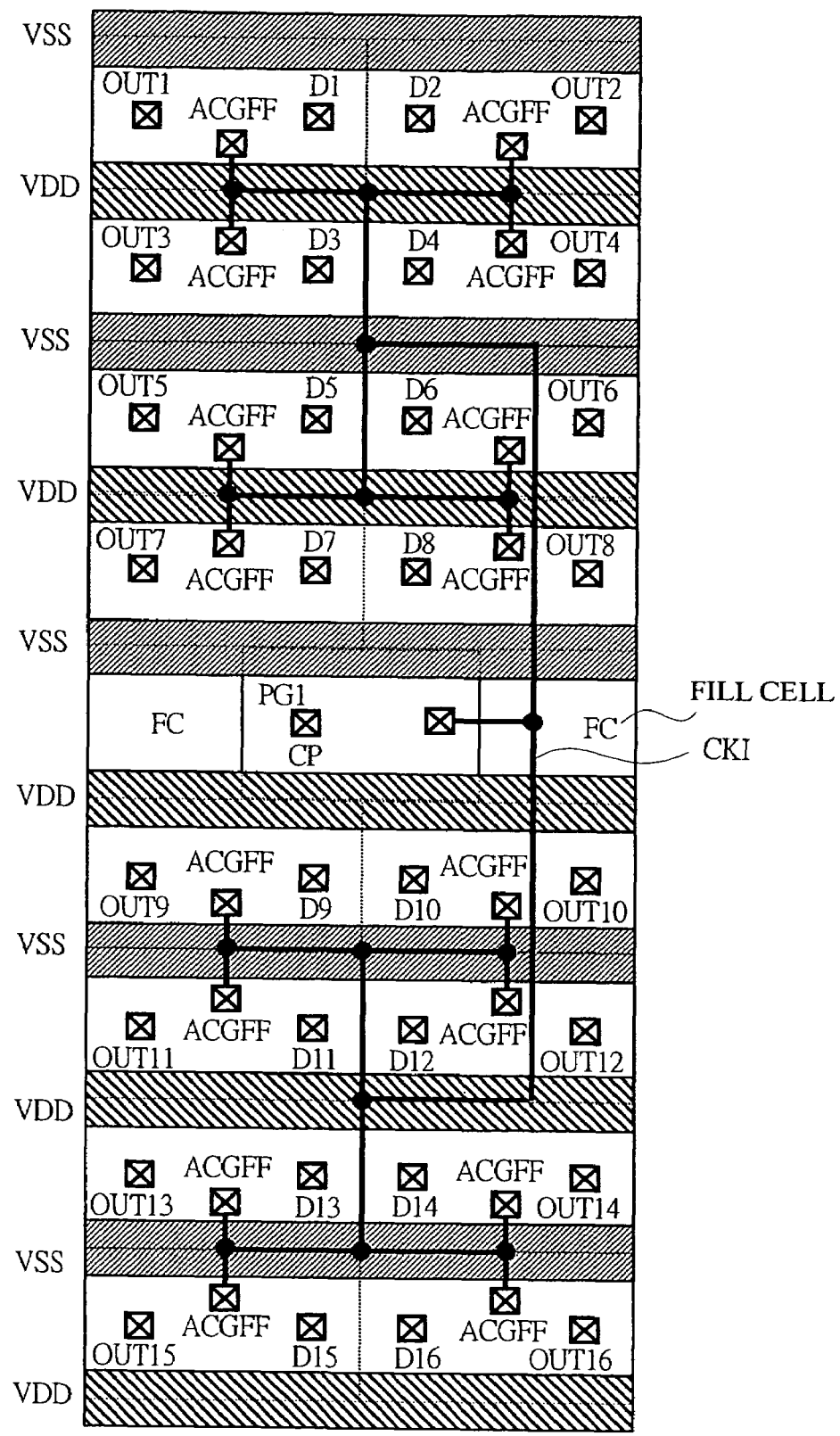
FIG. 12 is a layout drawing of one example of a layout of a hard macro cell according to one embodiment of the present invention.

FIG. 12 depicts a layout image of the ACGFF macro cell ACGFFMC.

The components thereof include fill cells FC, the pulse generator PG1, and auto-clock-gating flip-flops ACGFF. The fill cells are provided to fill gaps between cells.

The pulse generator PG1 is disposed at the center, and a plurality of auto-clock-gating flip-flops ACGFF are disposed above and below the pulse generator PG1. By this means, the input and output pins of the auto-clock-gating flip-flops ACGFF are not concentrated, wiring distance between the pulsed clock CK1 and each auto-clock-gating flip-flop ACGFF can be easily kept constant, and thus the load of the power sources can be distributed.

Note that, in FIG. 12, the power sources on the upper side are assumed to be the low level VSS, and those on the lower side are assumed to be the high level VDD. Alternatively, each level may be reversed. Also, wiring of the pulsed clock CKI can be arbitrarily laid as long as wiring distances to the respective auto-clock-gating flip-flops ACGFF are equal to one another. Furthermore, terminals of the input data D and the output data OUT of the auto-clock-gating flip-flops ACGFF can be disposed at arbitrary positions within the cell.

Figure 13:
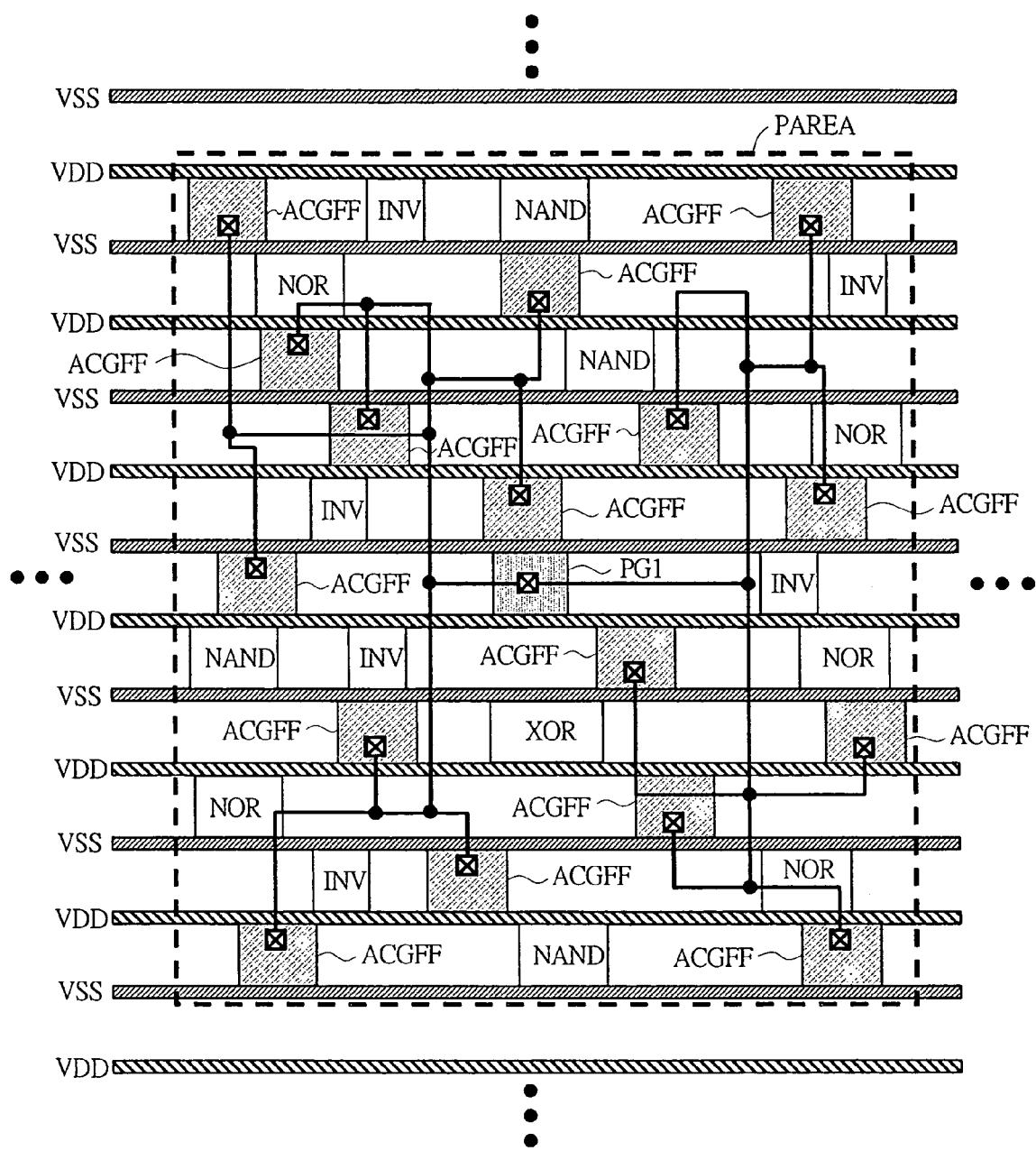
FIG. 13 is a layout drawing of one example of a layout of a soft macro cell according to one embodiment of the present invention.

FIG. 13 depicts a layout image of an ACGFF soft macro cell ACGFFSMC.

In this case, unlike FIG. 12, auto-clock-gating flip-flops ACGFF may be freely disposed within a certain area PAREA centering around the pulse generator PG1.

The auto-clock-gating flip-flops ACGFF can be freely disposed as long as the wiring distances of the pulsed clock CKI to the respective auto-clock-gating flip-flops ACGFF are equal to one another. Thus, an optimum layout can be achieved.

Figure 14:
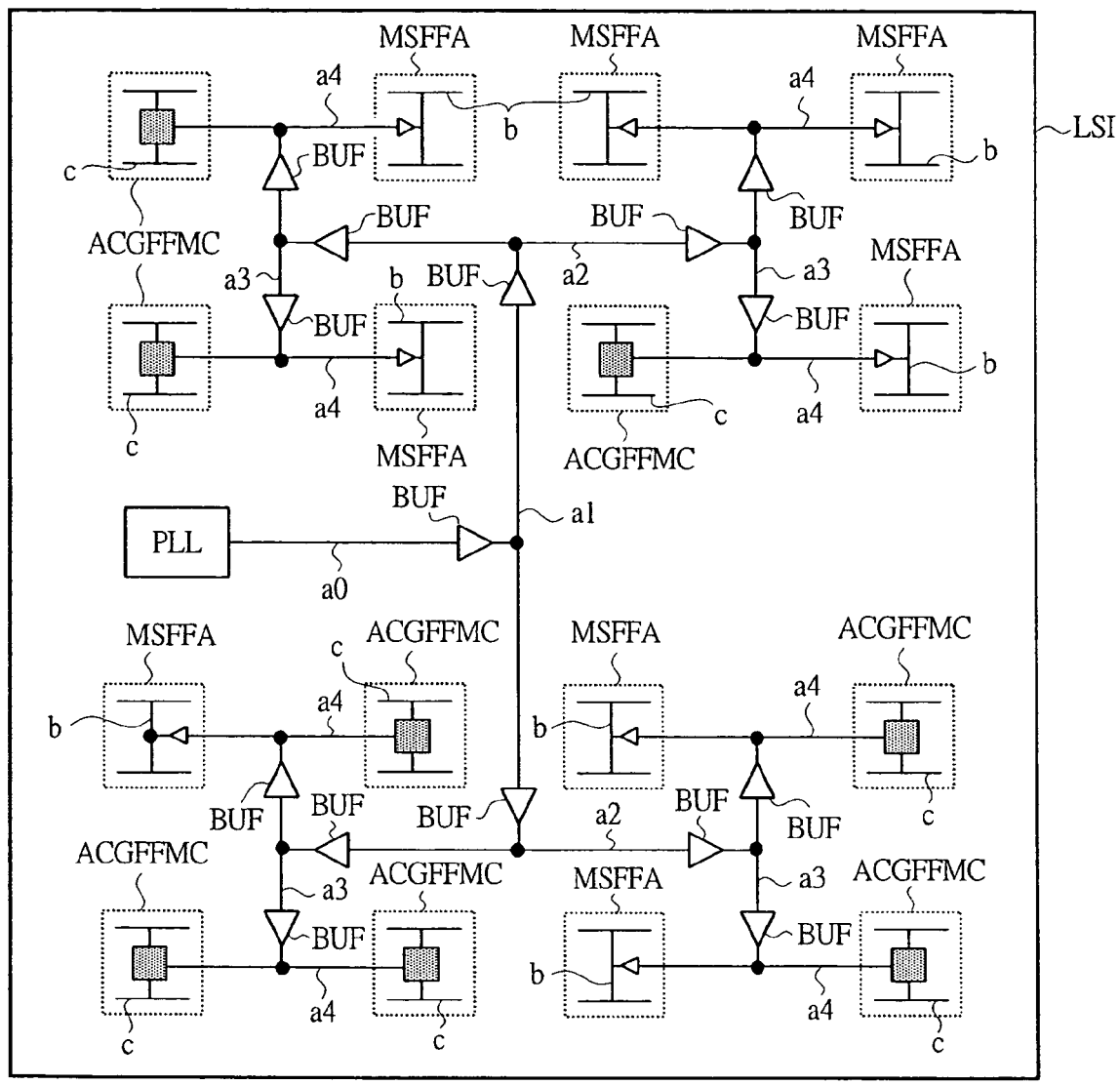
FIG. 14 is an explanatory diagram showing a chip image when the hard macro cell of FIG. 12 is applied to a part of flip-flops in a semiconductor integrated circuit device.

FIG. 14 depicts a chip image in which ACGFF macro cells ACGFFMC are applied to a part of flip-flops in a semiconductor integrated circuit device LSI.

A clock CP transmitted from an oscillator circuit using a PLL is propagated through a clock tree while being buffered by clock buffers BUF and then transferred to flip-flops and latch circuits at the end of the clock tree.

When an ACGFF macro cell ACGFFMC is to be applied to the semiconductor integrated circuit device LSI, the clock buffer BUF at the final stage of the clock tree and thereafter are replaced by the ACGFF macro cell ACGFFMC.

At this time, the ACGFF macro cell ACGFFMC for replacement may be a soft macro cell instead of a hard macro cell. Similarly, ACGFF macro cells ACGFFMC described below can be all replaced by not only a hard macro cell ACGFFMC but also a soft macro cell.

Furthermore, only a part of the flip-flops are replaced by a hard macro cell in FIG. 14. Alternatively, all flip-flops can be replaced by hard macro cells if timing restrictions can be satisfied.

Figure 15A:
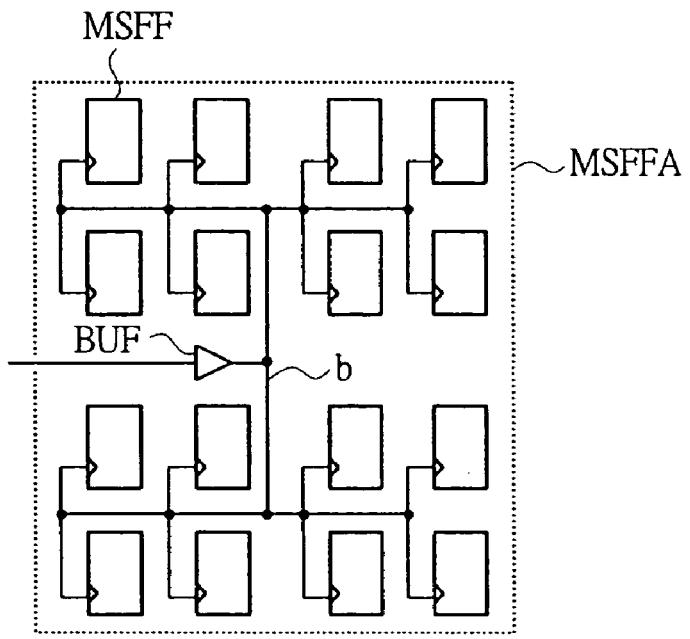
FIG. 15A is an explanatory diagram showing a configuration example in a flip-flop array of FIG. 14.
Figure 15B:
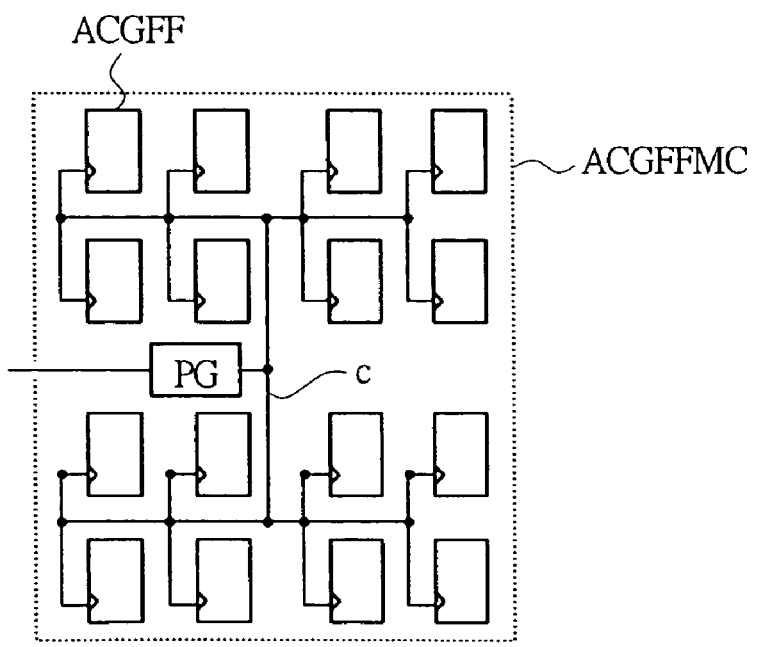
FIG. 15B is an explanatory diagram showing a configuration example in a flip-flop array of FIG. 14.

Still further, FIG. 15A and FIG. 15B respectively depict the configuration of the conventional flip-flop array MSFFA and ACGFF macro cell ACGFFMC shown in FIG. 14.

In FIG. 15A and FIG. 15B, the configuration includes plural flip-flops and a clock buffer BUF or a pulse generator PG.

Figure 16:
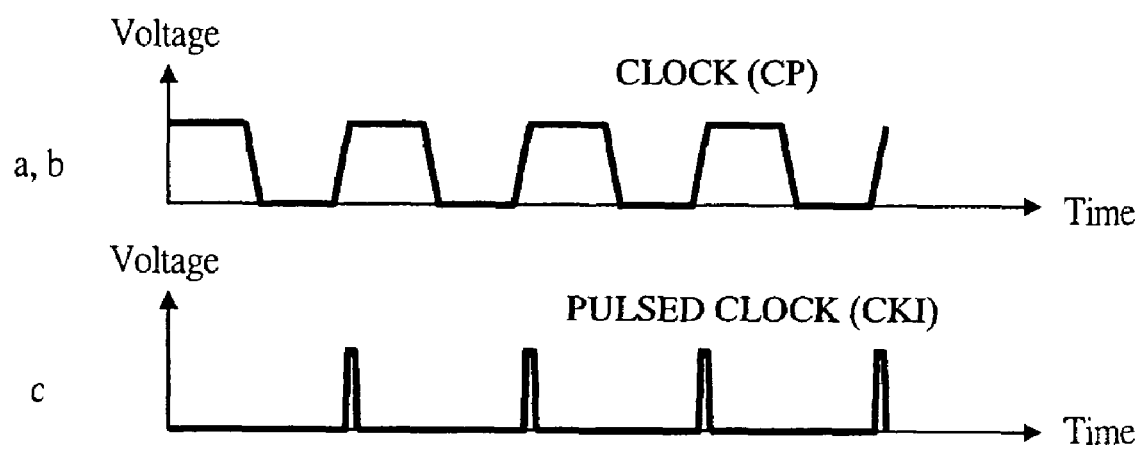
FIG. 16 is a timing chart showing one example of clock waveforms distributed to the flip-flop array of FIG. 14 and FIG. 15.

FIG. 16 depicts clock waveforms distributed in the configuration of FIG. 14 and FIG. 15.

In FIG. 14 and FIG. 15A, "a" and "b" denote the clock CP with a duty ratio of 50%. In FIG. 14 and FIG. 15B showing the configuration subsequent to the pulse generator PG in the ACGFF macro cell ACGFFMC, "c" denotes the pulsed clock CKI in which the period of the high level VDD is short.

Figure 17:
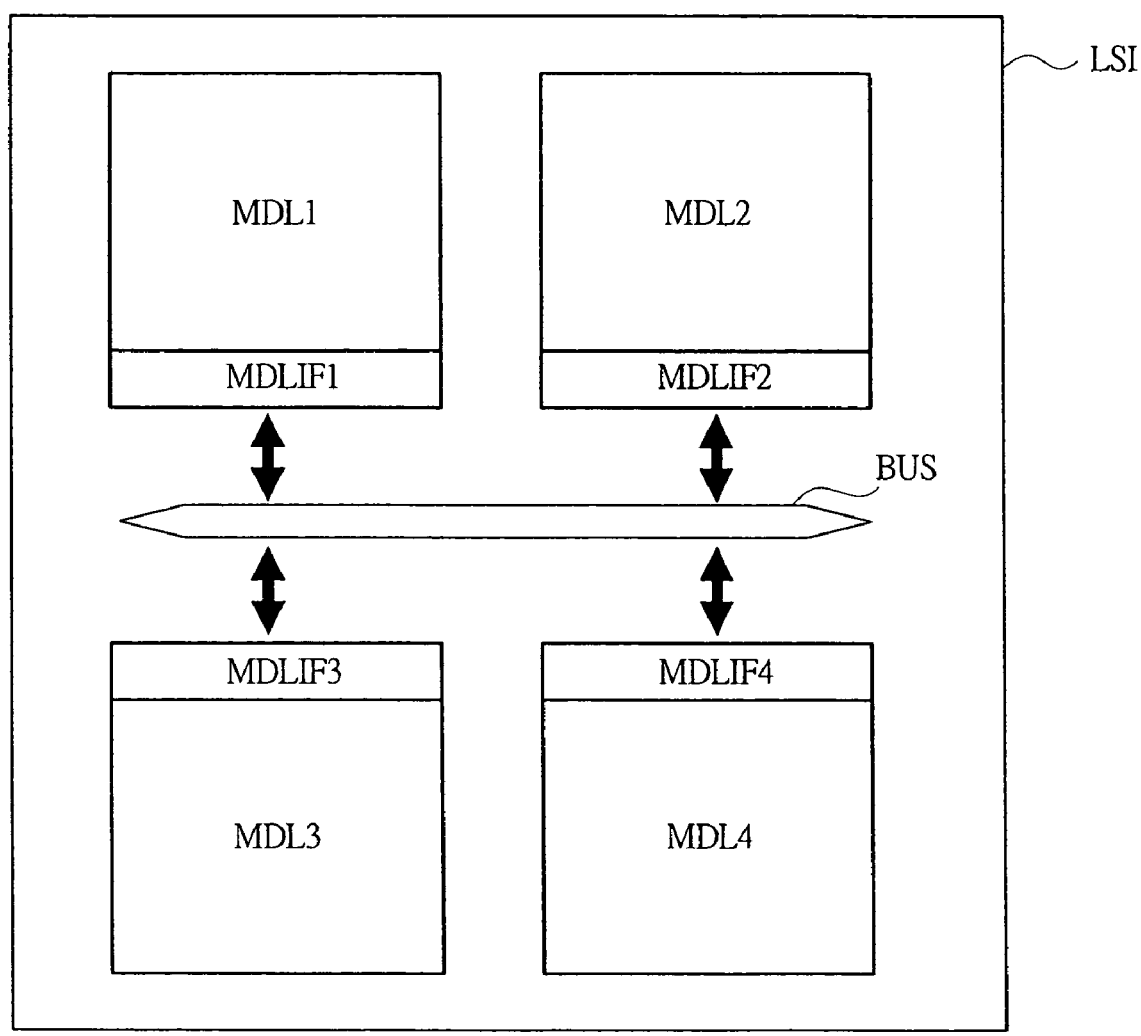
FIG. 17 is an explanatory diagram showing one example in which the hard macro cell of FIG. 12 is applied to a semiconductor integrated circuit device.

FIG. 17 depicts points of a semiconductor integrated circuit device LSI to which the ACGFF macro cell ACGFFMC is applied.

The ACGFF macro cell ACGFFMC has relatively more restrictions on the layout compared with other cells. Therefore, for example, if such a cell is applied to an interface between modules MDLs in which flip-flops having equal restrictive conditions are disposed in a concentrated manner or to a flip-flop for latency adjustment in a module MDL, the low power consumption can be achieved relatively easily.

Figure 18:
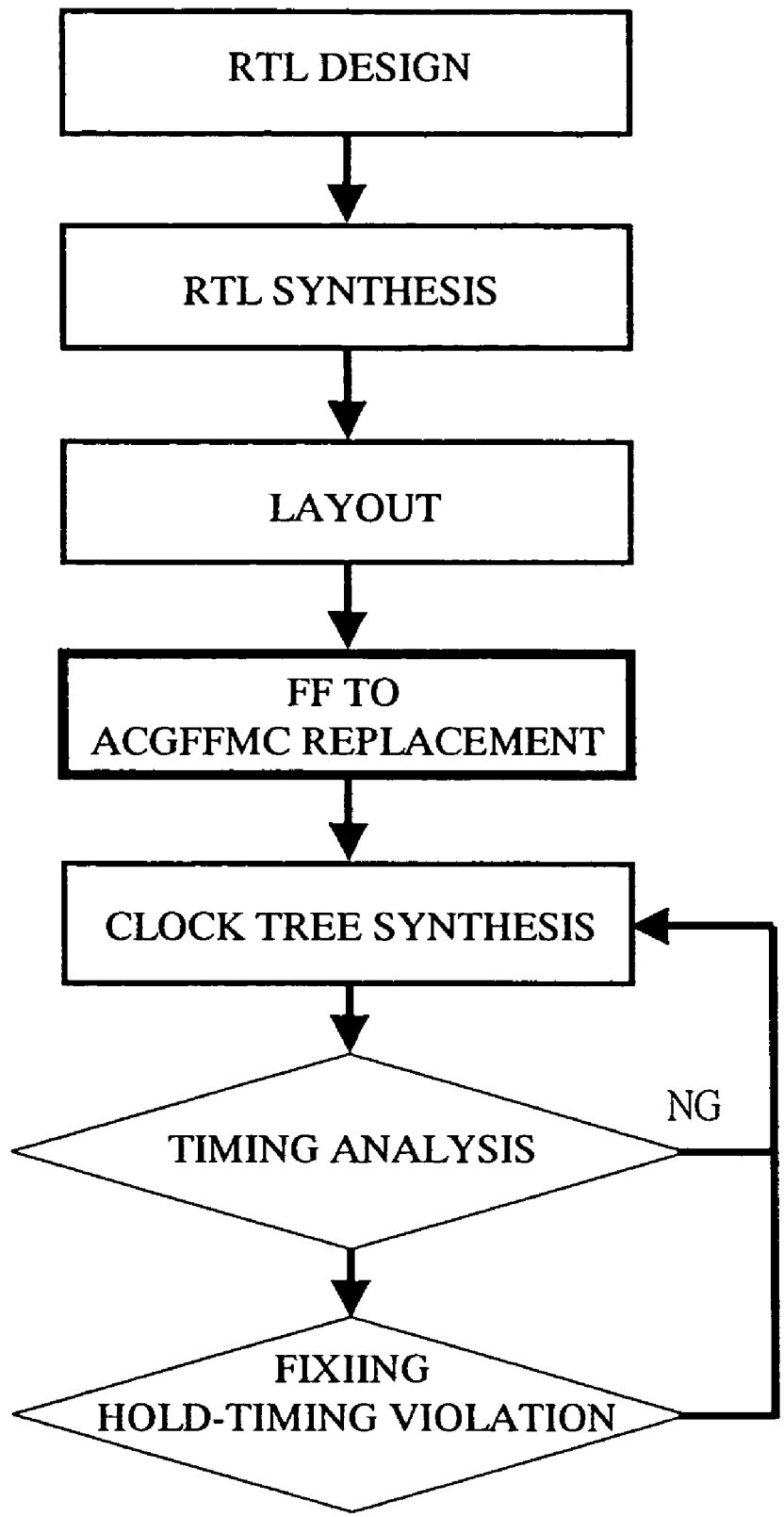
FIG. 18 is a flowchart showing a design flow in the case where the hard macro cell of FIG. 12 is applied to a semiconductor integrated circuit device.
Figure 19A:
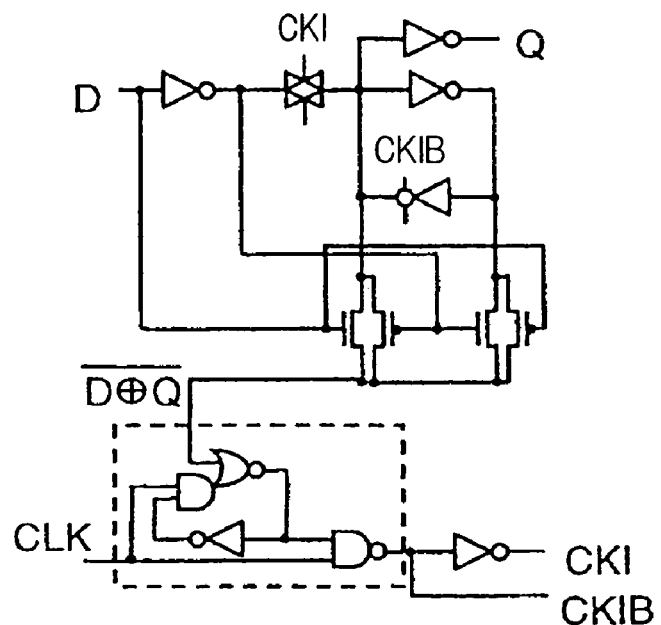
FIG. 19A is an explanatory diagram of a conventional example of a flip-flop circuit.
Figure 19B:
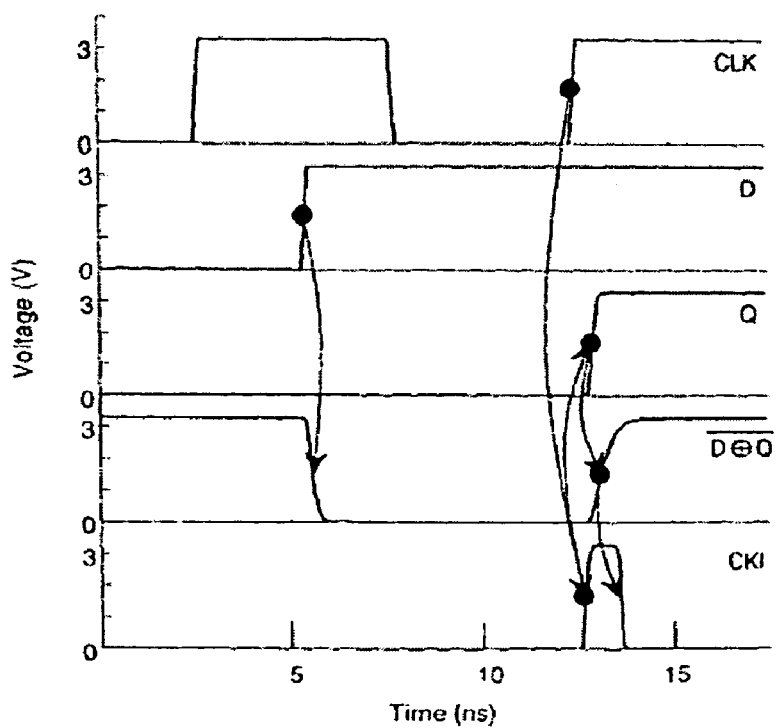
FIG. 19B is an explanatory diagram of a conventional example of a flip-flop circuit.

FIG. 18 depicts a design flow in the case where the ACGFF macro cell ACGFFMC is applied to a semiconductor integrated circuit device.

In this case, before synthesizing a clock tree for distributing a clock signal to a semiconductor integrated circuit device, the conventional flip-flop is replaced in advance by the ACGFF macro cell ACGFFMC of a hard macro cell or soft macro cell.

In this manner, it is possible to synthesize the above-described clock tree with taking into consideration the timing of clock supply to a conventional flip-flop or an ACGFF macro cell ACGFFMC of a hard macro cell or soft macro cell.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to a technology for reducing glitch power of a flip-flop provided in a semiconductor integrated circuit device.

What is claimed is:

1. A semiconductor integrated circuit device comprising:
   a pulse generator circuit to which an external clock signal is input, and which outputs a pulsed clock signal in synchronization with a transition of said external clock signal from a first level to a second level, a pulsed clock signal having a second level period shorter than that of said external clock signal;
   a data latch circuit to which an input data signal and an internal clock signal are input, and which incorporates a value of said input data signal during a period when the internal clock signal is at a fourth level, retains the incorporated value during a period when the internal clock signal is at a third level, and outputs the incorporated value as a retained data signal; and
   a data comparator circuit to which said pulsed clock signal, said input data signal of said data latch circuit, and said retained data signal are input,
   wherein said data comparator outputs the internal clock signal at the third level during a period when said pulsed clock signal is at the first level,
   wherein said data comparator compares said input data signal with said retained data signal during a period when said pulsed clock signal is at the second level, outputs said internal clock signal at the fourth level when the comparison result is inconsistent, and outputs said internal clock signal at the third level when the comparison result is consistent, and
   wherein, in said data comparator circuit, when the pulsed clock signal is at the first level, transistors to which said input data signal, said retained data signal, and inverted values of the input data signal and the retained data signal are respectively input is cut off from one of a power supply and ground by the pulsed clock signal.

2. The semiconductor integrated circuit device according to claim 1,
   wherein said data comparator circuit includes an exclusive OR circuit,
   said exclusive OR circuit includes said transistors,
   said transistors comprise two sets of two n-type MOSFETs each connected in series with each set connected in parallel, and
   a connection portion of one of said n-type MOSFETs connected in series is connected to ground, and a connection portion of the other one of said n-type MOSFETs connected in series is connected to a source side of an n-type MOSFET of an inverter circuit to which the pulsed clock signal is input.

3. The semiconductor integrated circuit device according to claim 1,
   wherein said data comparator circuit includes an exclusive OR circuit,
   said exclusive OR circuit includes said transistors,
   said transistors comprise two sets of two p-type MOSFETs each connected in series with each set connected in parallel, and
   a connection portion of one of the p-type MOSFETs connected in series is connected to the power supply, and a connection portion of the other one of the p-type MOSFETs connected in series is connected to a source side of a p-type MOSFET of an inverter circuit to which the pulsed clock signal is input.

4. The semiconductor integrated circuit device according to claim 1,
   wherein said data comparator circuit includes a feedback circuit which ensures the third level of the internal clock when the input data signal and the stored data signal are matched as a result of comparison during the period when the pulsed clock signal is at the second level.

5. The semiconductor integrated circuit device according to claim 4, further comprising:
   a transistor for controlling a current value supplied to said feedback circuit.

6. The semiconductor integrated circuit device according to claim 1,
   wherein a clocked inverter is used as a loop circuit for retaining data in said data latch circuit.

7. The semiconductor integrated circuit device according to claim 1,
   wherein an inverter is used as a loop circuit for retaining data in said data latch circuit.

8. The semiconductor integrated circuit device according to claim 1,
   wherein, in said data comparator circuit, a threshold voltage of each of the transistors to which the input data signal, the retained data signal, and inverted values of the input data signal and the retained data signal are input is lower than a threshold voltage of a transistor to which the pulsed clock signal is input.

9. The semiconductor integrated circuit device according to claim 1,
   wherein said first level is a low level, said second level is a high level, said third level is a low level, and said fourth level is a high level.

10. The semiconductor integrated circuit device according to claim 1,
    wherein said first level is a low level, said second level is a high level, said third level is a high level, and said fourth level is a low level.

11. The semiconductor integrated circuit device according to claim 1,
    wherein said first level is a high level, said second level is a low level, said third level is a low level, and said fourth level is a high level.

12. The semiconductor integrated circuit device according to claim 1,
    wherein said first level is a high level, said second level is a low level, said third level is a high level, and said fourth level is a low level.

13. The semiconductor integrated circuit device according to claim 1,
    wherein said pulse generator circuit, said data latch circuit, and said data comparator circuit are laid out as one cell.

14. The semiconductor integrated circuit device according to claim 1, wherein said pulse generator circuit is laid out as one cell, and said data latch circuit and said data comparator circuit are laid out as another cell.

15. The semiconductor integrated circuit device according to claim 14,
wherein a plurality of cells of said data latch circuit and said data comparator circuit are disposed at a predetermined distance from a cell of said pulse generator circuit so as to ensure a short second level period of said pulsed clock signal is output from said pulse generator circuit.

16. The semiconductor integrated circuit device according to claim 15,
wherein a cell of said pulse generator circuit, a plurality of cells of said data latch circuit, and a plurality of cells of said data comparator circuit are laid out in an array as one flip-flop cell.

17. The semiconductor integrated circuit device according to claim 16, wherein said flip-flop cell is laid out in portrait orientation.

18. The semiconductor integrated circuit device according to claim 16, wherein said flip-flop cell is disposed at an interface between a bus and a module.

* * * * *